United States Patent
Aida

(10) Patent No.: US 11,127,611 B2
(45) Date of Patent: Sep. 21, 2021

(54) HEATING PROCESSING APPARATUS AND HEATING PROCESSING METHOD

(71) Applicant: TOSHIBA MEMORY CORPORATION, Minato-ku (JP)

(72) Inventor: Makoto Aida, Yatomi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 321 days.

(21) Appl. No.: 16/284,262

(22) Filed: Feb. 25, 2019

(65) Prior Publication Data
US 2020/0075365 A1    Mar. 5, 2020

(30) Foreign Application Priority Data

Aug. 28, 2018    (JP) .............................. JP2018-159671

(51) Int. Cl.
*H01L 21/67*    (2006.01)
*G05B 19/418*    (2006.01)

(52) U.S. Cl.
CPC .. *H01L 21/67248* (2013.01); *G05B 19/41875* (2013.01); *H01L 21/67103* (2013.01); *H01L 21/67259* (2013.01); *H01L 21/67288* (2013.01); *G05B 2219/37224* (2013.01); *G05B 2219/45031* (2013.01)

(58) Field of Classification Search
None
See application file for complete search history.

(56) References Cited

U.S. PATENT DOCUMENTS

| | | | |
|---|---|---|---|
| 6,568,847 B2 | 5/2003 | Nishijima et al. | |
| 2005/0065634 A1 | 3/2005 | Nakajima et al. | |
| 2006/0241891 A1* | 10/2006 | Kaushal | H01L 21/67248 702/136 |
| 2007/0272680 A1* | 11/2007 | Tadokoro | H05B 1/0233 219/494 |

(Continued)

FOREIGN PATENT DOCUMENTS

| | | |
|---|---|---|
| JP | 3581303 B2 | 10/2004 |
| JP | 2005-117007 | 4/2005 |
| JP | 2009-123816 | 6/2009 |

(Continued)

OTHER PUBLICATIONS

Tay et. al. Estimation of wafer warpage profile during thermal processing in microlithography, Rev. Sci. Instrum. 76, 075111 (2005); https://doi.org/10.1063/1.1979468 (Year: 2005).*

*Primary Examiner* — Kenneth M Lo
*Assistant Examiner* — Istiaque Ahmed
(74) *Attorney, Agent, or Firm* — Oblon, McClelland, Maier & Neustadt, L.L.P.

(57) ABSTRACT

According to one embodiment, a controller calculates an estimation temperature profile, which represents a change with time in temperature of a substrate mounting surface in a state where a substrate is placed on a substrate stage, from warp amount information indicating a warp of the substrate. Further, the controller detects abnormality of a placement state of the substrate, on a basis of a difference between an actual measurement temperature profile, which represents a change with time in actual temperature measured by a temperature sensor in a state where the substrate is placed on the substrate stage, and the estimation temperature profile.

20 Claims, 7 Drawing Sheets

(56) References Cited

U.S. PATENT DOCUMENTS

2008/0025368 A1* 1/2008 Aderhold .............. G01J 5/0022
                                                        374/102
2011/0174800 A1* 7/2011 Chino ................. C23C 16/4583
                                                       219/446.1

FOREIGN PATENT DOCUMENTS

| JP | 4781931 B2 | 9/2011 |
| JP | 2012-151247 | 8/2012 |
| JP | 6107742 B2 | 4/2017 |

* cited by examiner

P11: ESTIMATION VALUE

P12: ACTUAL MEASUREMENT VALUE

P13: ACTUAL MEASUREMENT VALUE

HEATING PROCESSING APPARATUS AND HEATING PROCESSING METHOD

CROSS-REFERENCE TO RELATED APPLICATIONS

This application is based upon and claims the benefit of priority from Japanese Patent Application No. 2018-159671, filed on Aug. 28, 2018; the entire contents of which are incorporated herein by reference.

FIELD

Embodiments described herein relate generally to a heating processing apparatus and a heating processing method.

BACKGROUND

Conventionally, for a heating processing apparatus that heats a substrate by a substrate stage including a heater built therein, a technique is known that detects whether the substrate is placed with deviation on the substrate stage.

However, in this conventional technique, a warp of the substrate is not considered. Accordingly, when a substrate having a warp is to be heated, there is a case where it is determined that the substrate is not placed at a right position even though the substrate is placed at the right position.

DETAILED DESCRIPTION

In general, according to one embodiment, a heating processing apparatus includes a substrate stage including a heater built therein, a temperature sensor configured to measure temperature of a substrate mounting surface of the substrate stage, and a controller configured to control heating to a substrate on the substrate stage, and to detect abnormality of a placement state of the substrate on the substrate stage. The controller is configured to calculate an estimation temperature profile, which represents a change with time in temperature of the substrate mounting surface in a state where the substrate is placed on the substrate stage, from warp amount information indicating a warp of the substrate. Further, the controller is configured to detect abnormality of a placement state of the substrate, on a basis of a difference between an actual measurement temperature profile, which represents a change with time in actual temperature measured by the temperature sensor in a state where the substrate is placed on the substrate stage, and the estimation temperature profile.

Exemplary embodiments of a heating processing apparatus and a heating processing method will be explained below in detail with reference to the accompanying drawings. The present invention is not limited to the following embodiments.

First Embodiment

Figure 1:
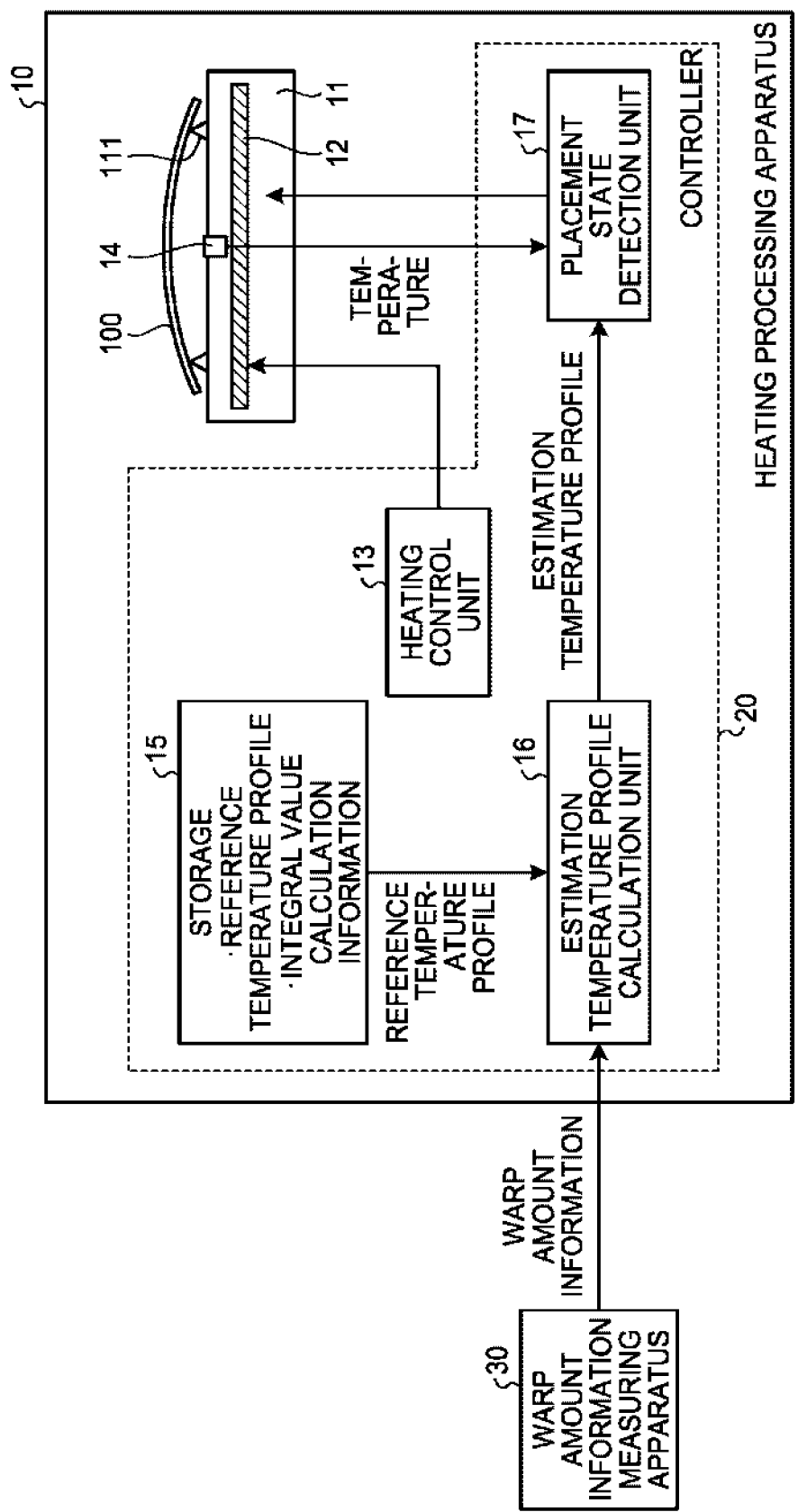
FIG. 1 is a diagram schematically illustrating a configuration example of a heating processing apparatus according to a first embodiment.

FIG. 1 is a diagram schematically illustrating a configuration example of a heating processing apparatus according to a first embodiment. The heating processing apparatus 10 includes a substrate stage 11, a heater 12, a temperature sensor 14, and a controller 20. Here, the heating processing apparatus 10 is a semiconductor manufacturing apparatus.

The substrate stage 11 is a plate-like member configured to support a heating object substrate 100. Here, the substrate 100 is a semiconductor substrate. The semiconductor substrate is provided with a semiconductor storage device of a three-dimensional multilayer type. In the case of a semiconductor storage device with a large capacity, because the number of stacked layers is large, there is a case where a warp has been generated on the semiconductor substrate. The upper surface of the substrate stage 11, which serves as a substrate mounting surface, is provided with support portions 111 for supporting the substrate 100. For example, the support portions 111 are arranged at three or more positions on the upper surface of the substrate stage 11.

The substrate stage 11 is equipped with a heater 12 built inside. The heater 12 is connected to a heating control unit 13 described later, to be heated under the control of the heating control unit 13.

The temperature sensor 14 is provided near the upper surface of the substrate stage 11. The temperature sensor 14 measures the temperature of the upper surface of the substrate stage 11, and outputs the temperature to a placement state detection unit described later. In the first embodiment, the temperature sensor 14 is preferably arranged at about the center of the upper surface of the substrate stage 11.

The controller 20 is configured to control heating to the substrate 100 on the substrate stage 11, and to detect abnormality of the placement state of the substrate 100 on the substrate stage 11. The controller 20 includes the heating control unit 13, a storage 15, an estimation temperature profile calculation unit 16, and a placement state detection unit 17. The heating control unit 13 switches the ON/OFF of the heater 12 to control the heating to set the substrate stage 11 at a predetermined temperature.

The storage 15 stores a reference temperature profile and integral value calculation information for use in calculation of an estimation temperature profile. The reference temperature profile is a profile that represents a change with time in the temperature of the upper surface of the substrate stage 11 in a case where a substrate 100 having no warp is placed at a right position and in a normal state on the substrate stage 11 set at a predetermined temperature. The right position means a position where the substrate 100 is placed within acceptable limits with reference to the proper placement position. For example, as the substrate 100 has to be placed on all the support portions 111 on the substrate stage 11, if the substrate 100 is not placed on one or more of the support portions 111, the substrate 100 cannot be regarded as being placed at the right position. Further, the normal state means a state where no foreign substance is present between the substrate stage 11 and the substrate 100.

Figure 2:
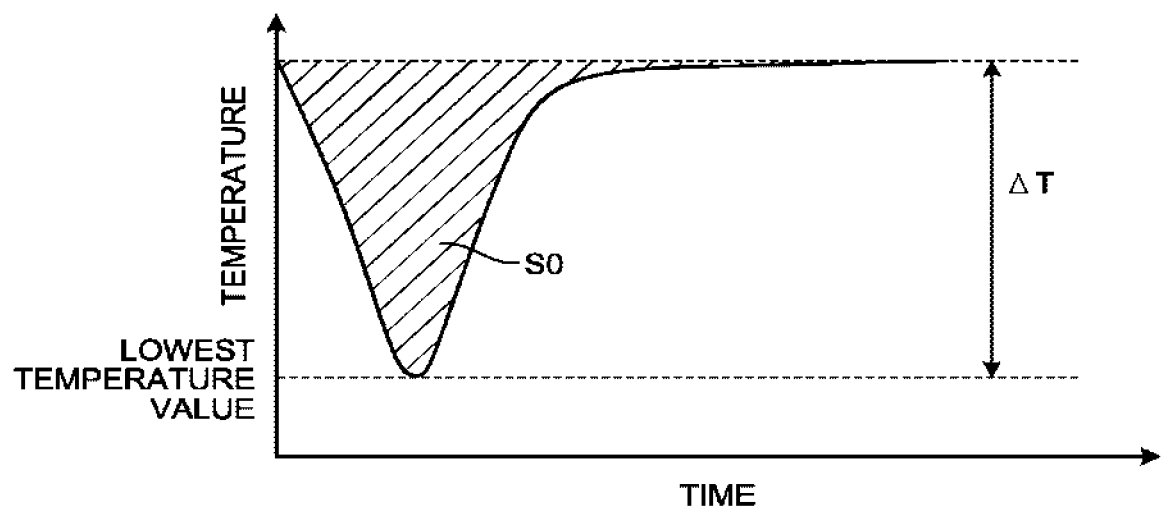
FIG. 2 is a diagram illustrating an example of a reference temperature profile.

FIG. 2 is a diagram illustrating an example of the reference temperature profile. In FIG. 2, the horizontal axis indicates the lapse of time since the substrate 100 is placed on the substrate stage 11, and the vertical axis indicates the temperature of the upper surface of the substrate stage 11. As illustrated in FIG. 2, when the substrate 100 having no warp is placed at the right position and in the normal state on the substrate stage 11, the temperature is lowered temporarily by, for example, $\Delta T$, due to an influence of the substrate 100 lower in temperature than the substrate stage 11. Thereafter, the substrate 100 is gradually heated, and the substrate 100 and the substrate stage 11 come to have almost the same temperature. It is assumed, in the temperature of the upper surface of the substrate stage 11, that an integral value of temperature change at this time is denoted by S0. The $\Delta T$ is the maximum value of temperature change in the reference temperature profile, and corresponds to the difference between a predetermined temperature of the substrate stage 11 kept in heating processing and the lowest temperature value of the substrate stage 11 in the heating processing.

The integral value calculation information is information that shows the relation between a substrate warp amount and an integral value of temperature change in the temperature of the upper surface of the substrate stage 11. In general, when each of substrates 100 difference in warp amount is placed and heated at the right position and in the normal state on the substrate stage 11, there is a negative correlation between the warp amount and the integral value of temperature change in the temperature of the upper surface of the substrate stage 11. Specifically, as the warp amount of a substrate 100 is larger, the integral value tends to be smaller. Accordingly, on the basis of the warp amount of a substrate 100, the integral value can be estimated for a case where the substrate 100 is placed at the right position and in the normal state on the substrate stage 11.

Figure 3:
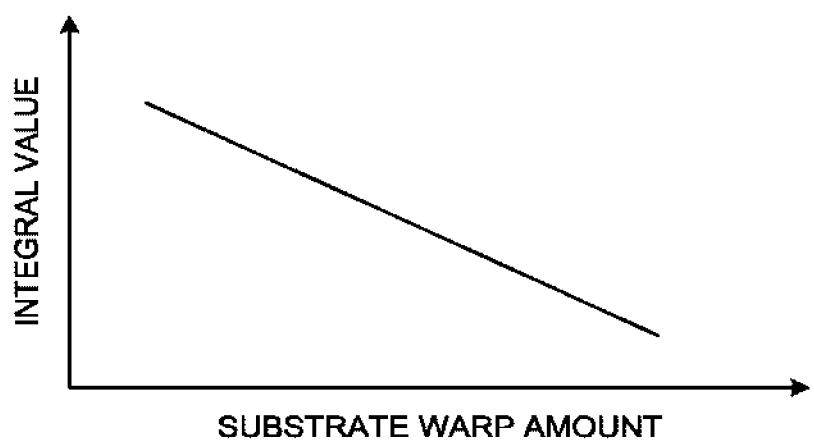
FIG. 3 is a diagram illustrating an example of integral value calculation information.

FIG. 3 is a diagram illustrating an example of the integral value calculation information. In FIG. 3, the horizontal axis indicates the substrate warp amount, and the vertical axis indicates the integral value. As illustrated by these axes, the substrate warp amount and the integral value has a negative correlation therebetween.

The estimation temperature profile calculation unit 16 calculates an estimation temperature profile, by using warp amount information about a heating object substrate, and the reference temperature profile and the integral value calculation information in the storage 15, and outputs the estimation temperature profile thus calculated to the placement state detection unit 17. Here, the first embodiment takes, as an example, a case where the estimation temperature profile calculation unit 16 calculates a change amount concerning temperature change obtained from the estimation temperature profile, and outputs this change amount to the placement state detection unit 17. The change amount may be exemplified by an estimation integral value of temperature change in the estimation temperature profile.

The warp amount information about a substrate 100 is measured by a warp amount information measuring apparatus 30. The warp amount information measuring apparatus 30 may be formed of a unit configured to measure the height of respective positions on the substrate 100 by using a laser displacement sensor, for example. Alternatively, the warp amount information measuring apparatus 30 may be formed of a unit configured to measure the warp amount of a substrate 100 by irradiating the substrate 100 with light from the side surface and finding positions of the substrate 100 where the transmitted light is made darker.

Figure 4A:
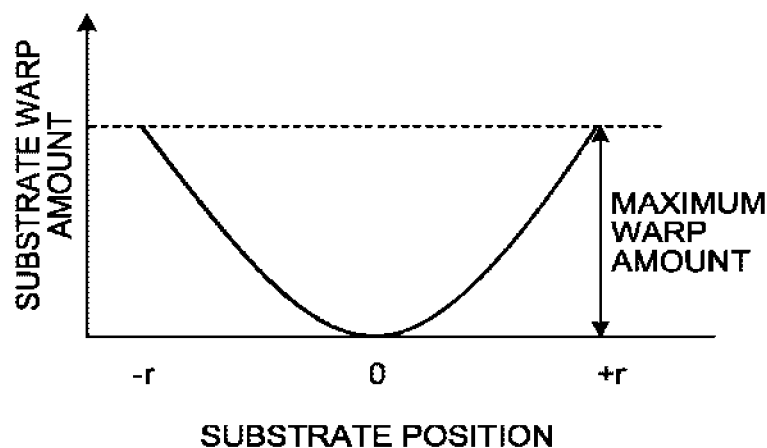
FIGS. 4A and 4B are diagrams for explaining a substrate warp amount.
Figure 4B:
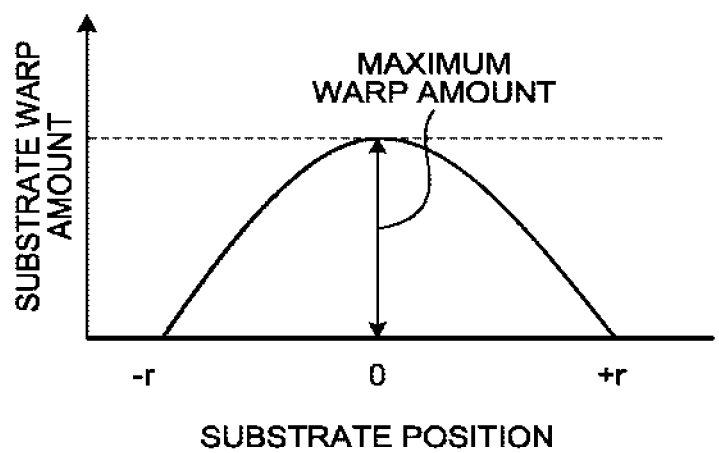

FIGS. 4A and 4B are diagrams for explaining a substrate warp amount. Each of FIGS. 4A and 4B illustrates a case where a substrate 100 is warped in a bowl shape. Here, FIG. 4A illustrates a case where a substrate 100 has a bowl shape protruding downward. FIG. 4B illustrates a case where a substrate 100 has a bowl shape protruding upward. For example, it is assumed that the upper surface of the stage for placing a substrate 100 thereon in the warp amount information measuring apparatus 30 is used as a reference, and the distance from the upper surface of the stage to each position of the substrate 100 is a warp amount. The largest one of such warp amounts will be referred to as "maximum warp amount". For example, the warp amount information may be information that shows a warp amount at each position in the plane of a substrate 100. Alternatively, this information may be information that shows a warp amount at each position, in the side surface direction of a substrate 100. Alternatively, this information may be information that shows the maximum warp amount of a substrate 100. Here, as illustrated in FIGS. 4A and 4B, in the case of a bowl shape, the warp amount becomes smaller, as the position is more distant from the position of the maximum warp amount.

The estimation temperature profile calculation unit 16 obtains the maximum warp amount from the warp amount information, and acquires an integral value Sa corresponding to the maximum warp amount with reference to the integral value calculation information. Then, the estimation temperature profile calculation unit 16 calculates, as a coefficient value K, the ratio Sa/S0 of the integral value Sa relative to the integral value S0 of temperature change in the reference temperature profile. Further, the estimation temperature profile calculation unit 16 creates an estimation temperature profile from the reference temperature profile in accordance with a predetermined algorithm (function) using the coefficient value K. Then, the estimation temperature profile calculation unit 16 calculates an estimation integral value of temperature change from the estimation temperature profile, and outputs the estimation integral value thus calculated to the placement state detection unit 17.

Figure 5:
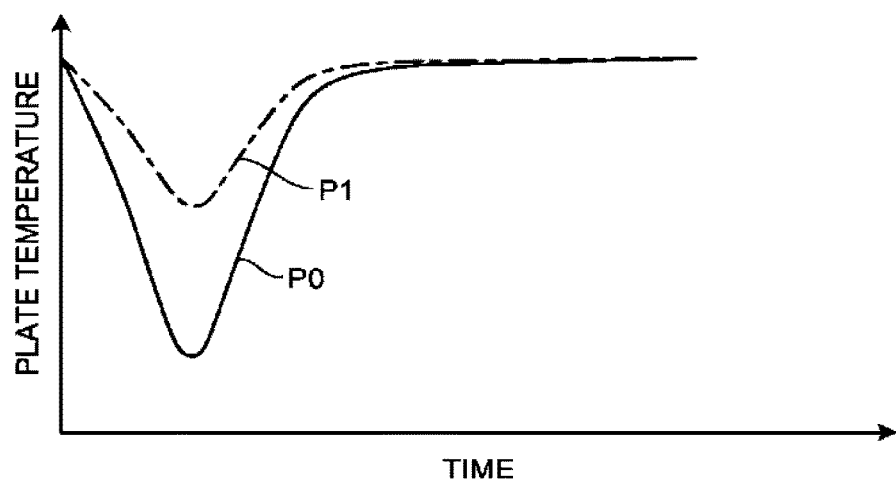
FIG. 5 is a diagram illustrating an example of calculation of an estimation temperature profile.

FIG. 5 is a diagram illustrating an example of calculation of an estimation temperature profile. In FIG. 5, the horizontal axis indicates the lapse of time since the substrate 100 is placed on the substrate stage 11 set at a predetermined temperature, and the vertical axis indicates the temperature of the upper surface of the substrate stage 11. In FIG. 5, as an example, the estimation temperature profile P1 is formed by multiplying the reference temperature profile P0 by the coefficient value K. In this way, the estimation temperature profile P1 can be obtained. Here, the method for calculating the estimation temperature profile P1 is arbitrary, and another method may be used for this calculation.

The placement state detection unit 17 obtains temperature from the temperature sensor 14 provided on the upper surface of the substrate stage 11, and creates a profile of actual measurement temperature (which will be referred to as "actual measurement temperature profile"), by plotting the temperature to time. Further, the placement state detection unit 17 compares the actual measurement temperature profile thus created with the estimation temperature profile obtained from the estimation temperature profile calculation unit 16, and thereby detects abnormality of the placement state of the substrate 100.

Here, in the first embodiment, the placement state detection unit 17 calculates a change amount concerning temperature change obtained from the actual measurement temperature profile. The change amount may be exemplified by an actual measurement integral value of temperature change in the actual measurement temperature profile. Further, the placement state detection unit 17 determines whether the difference between the actual measurement integral value and the estimation integral value obtained from the estimation temperature profile calculation unit 16 is equal to or larger than a determination threshold. The determination threshold is a value at which the actual measurement integral value and the estimation integral value are statistically equal to each other. When the difference is smaller than the determination threshold, the placement state detection unit 17 determines that the substrate 100 is placed at the right position and in the normal state on the substrate stage 11. On the other hand, when the difference is equal to or larger than the determination threshold, the placement state detection unit 17 determines that the substrate 100 is not placed at the right position on the substrate stage 11 or the substrate 100 is not placed in the normal state on the substrate stage 11. The case where the substrate 100 is not placed in the normal state means a case where a foreign substance is present between the substrate stage 11 and the substrate 100. When determining that the substrate 100 is not placed in the normal state, the placement state detection unit 17 outputs error information. When the error information is output, the heating processing apparatus 10 may be stopped, or the substrate 100 associated with the output error information may be recorded. In the latter case, for example, after the lot unit process ends, the substrate 100 associated with the output error information can be taken out and can be processed again by the heating processing apparatus 10.

Figure 6:
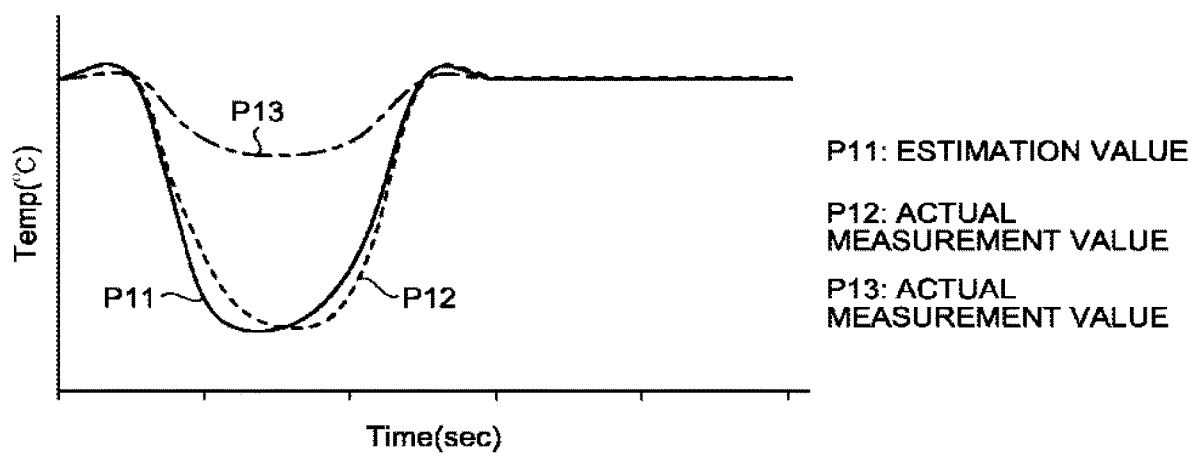
FIG. 6 is a diagram illustrating an example of detecting the placement state of a substrate by using an estimation temperature profile and an actual measurement temperature profile.

FIG. 6 is a diagram illustrating an example of detecting the placement state of a substrate by using an estimation temperature profile and an actual measurement temperature profile. Here, first, the estimation temperature profile calculation unit 16 acquires an integral value, from warp amount information about the substrate 100 and the integral value calculation information, and calculates a coefficient value K, which is a ratio of the integral value thus acquired relative to the integral value of the reference temperature profile. Then, the estimation temperature profile calculation unit 16 acquires an estimation temperature profile P11, which is calculated from the reference temperature profile in accordance with a predetermined algorithm using the coefficient value K. The estimation temperature profile P11 is indicated by the solid line in FIG. 6.

In a state where the substrate stage 11 of the heating processing apparatus 10 is heated to a predetermined temperature, the temperature sensor 14 measures the temperature of the upper surface of the substrate stage 11 after the substrate 100 is placed on the substrate stage 11. Then, the placement state detection unit 17 creates an actual measurement temperature profile P12 or P13 that represents a change with time in the temperature measured by the temperature sensor 14.

For example, when the actual measurement temperature profile P12 is in a state illustrated by a broken line in FIG. 6, the actual measurement integral value of the actual measurement temperature profile P12 is almost the same in degree as the estimation integral value of the estimation temperature profile P11, and thus the difference therebetween becomes smaller than a determination threshold. As a result, the placement state detection unit 17 comes to determine that the substrate 100 having a warp is placed at the right position and in the normal state on the substrate stage 11.

On the other hand, when the actual measurement temperature profile P13 is in a state illustrated by a chain line, the actual measurement integral value of the actual measurement temperature profile P13 is smaller than the estimation integral value of the estimation temperature profile P11. Accordingly, the difference between the actual measurement integral value of the actual measurement temperature profile P13 and the estimation integral value of the estimation temperature profile P11 becomes equal to or larger than the determination threshold. As a result, the placement state detection unit 17 comes to determine that the substrate 100 having a warp is not placed at the right position on the substrate stage 11 or the substrate 100 is placed in an abnormal state such that, e.g., a foreign substance is present between the substrate stage 11 and the substrate 100.

Figure 7:
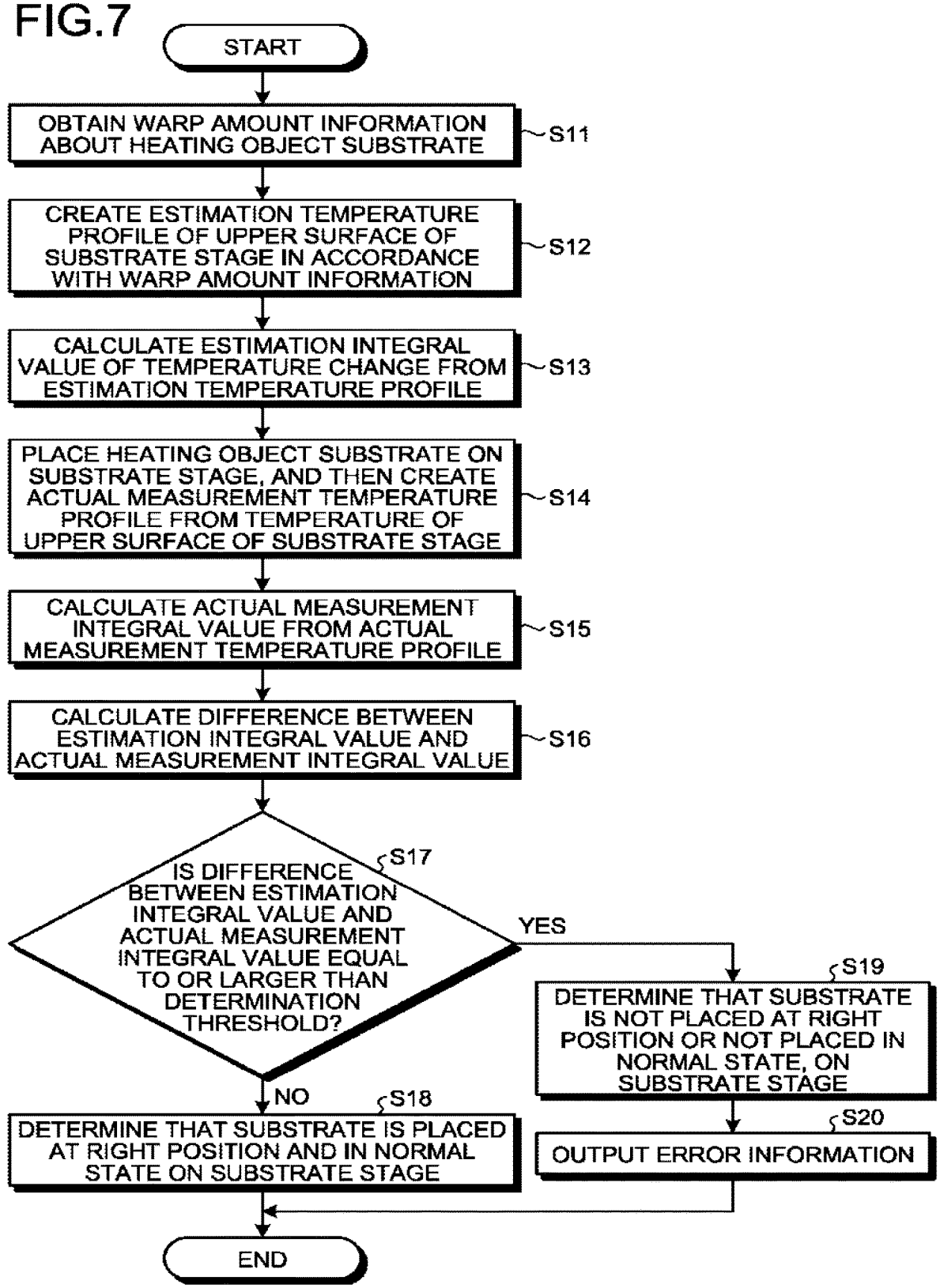
FIG. 7 is a flowchart illustrating an example of the sequence of a heating processing method according to the first embodiment.

Next, an explanation will be given of a heating processing method. Here, an explanation will be given of a heating processing method serving as a semiconductor manufacturing method. FIG. 7 is a flowchart illustrating an example of the sequence of a heating processing method according to the first embodiment. First, the warp amount information measuring apparatus 30 measures warp amount information about a heating object substrate 100, and the estimation temperature profile calculation unit 16 of the heating processing apparatus 10 obtains the warp amount information (step S11).

Then, the estimation temperature profile calculation unit 16 creates an estimation temperature profile of the upper surface of the substrate stage 11 in accordance with the warp amount information (step S12). Specifically, the estimation temperature profile calculation unit 16 acquires an integral value corresponding to the warp amount information acquired by using the integral value calculation information in the storage 15. Then, the estimation temperature profile calculation unit 16 calculates a coefficient value that is a ratio of the integral value thus acquired relative to the integral value of the reference temperature profile, and alters the reference temperature profile by using this coefficient value to create the estimation temperature profile.

Thereafter, the estimation temperature profile calculation unit 16 calculates an estimation integral value of temperature change from the estimation temperature profile thus created (step S13). Then, the estimation temperature profile calculation unit 16 outputs the estimation integral value to the placement state detection unit 17.

Then, when the heating object substrate 100 is placed on the substrate stage 11 heated to a predetermined temperature, the placement state detection unit 17 creates an actual measurement temperature profile by using the temperature of the upper surface of the substrate stage 11 measured thereafter by the temperature sensor 14 (step S14). Further, the placement state detection unit 17 calculates an actual measurement integral value from the actual measurement temperature profile (step S15), and calculates the difference between the estimation integral value and the actual measurement integral value (step S16).

Thereafter, the placement state detection unit 17 determines whether the difference between the estimation integral value and the actual measurement integral value is equal to or larger than a determination threshold (step S17). When the difference between the estimation integral value and the actual measurement integral value is smaller than the determination threshold (No at step S17), the placement state detection unit 17 determines that the substrate 100 is placed at the right position and in the normal state on the substrate stage 11 (step S18). Then, after a lapse of a predetermined heating processing time, the substrate 100 is unloaded from the heating processing apparatus 10, and the processing sequence ends.

On the other hand, when the difference between the estimation integral value and the actual measurement integral value is equal to or larger than the determination threshold (Yes at step S17), the placement state detection unit 17 determines that the substrate 100 is not placed at the right position on the substrate stage 11 or the substrate 100 is not placed in the normal state on the substrate stage 11 (step S19), and outputs error information (step S20). Then, after a lapse of a predetermined heating processing time, the substrate 100 is unloaded from the heating processing apparatus 10, and the processing sequence ends.

For example, the heating processing apparatus 10 described above is used for heating a semiconductor substrate after a resist is applied thereto and a light-exposure process is performed thereto and before a development process is performed thereto.

In the first embodiment, from warp amount information indicating the warp of a heating object substrate 100, an estimation temperature profile is created for a case where the substrate 100 is placed at the right position and in the normal state. When the substrate 100 is placed on the substrate stage 11, an actual measurement temperature profile of the upper surface of the substrate stage 11 is acquired. Further, on the basis of the difference between the actual measurement temperature profile and the estimation temperature profile, abnormality of the placement state of the substrate 100 is detected. Specifically, the abnormality represents a case where the substrate 100 is not placed at the right position on the substrate stage 11 or the substrate 100 is not placed in the normal state on the substrate stage 11. Consequently, when the substrate 100 has a warp, it is possible to determine whether the substrate 100 is placed at the right position on the substrate stage 11, and whether the substrate 100 is placed in the normal state on the substrate stage 11, by considering temperature change due to the warp of the substrate 100.

Second Embodiment

Figure 8:
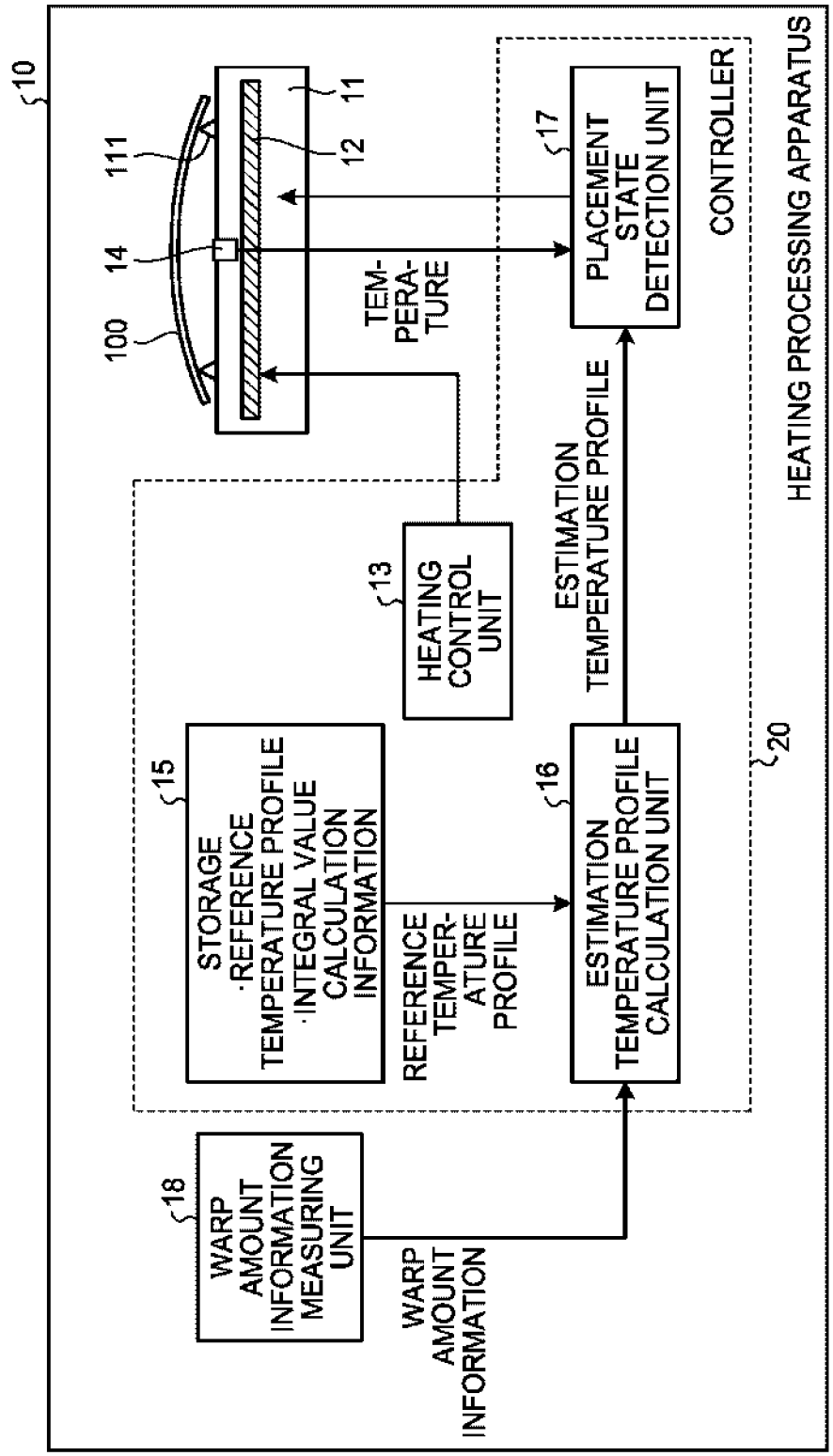
FIG. 8 is a diagram schematically illustrating a configuration example of a heating processing apparatus according to a second embodiment.

FIG. 8 is a diagram schematically illustrating a configuration example of a heating processing apparatus according to a second embodiment. As illustrated in FIG. 8, the heating processing apparatus 10 according to the second embodiment is provided with a warp amount information measuring unit 18 inside the heating processing apparatus 10. The warp amount information measuring unit 18 is configured to measure the warp amount of a heating object substrate 100, and thus corresponds to the warp amount information measuring apparatus 30 according to the first embodiment. Here, the heating processing apparatus 10 is a semiconductor manufacturing apparatus. The other parts of the configuration are the same as those described in the first embodiment, and thus their description will be omitted. Further, a heating processing method according to the second embodiment, serving as a semiconductor manufacturing method, is the same as the heating processing method according to the first embodiment, and thus its description will be also omitted.

Also in the second embodiment, an effect substantially the same as that of the first embodiment can be obtained.

Third Embodiment

In the first embodiment, a temperature measured at one position on the upper surface of the substrate stage is used to determine whether a substrate having a warp is placed at the right position and in the normal state on the substrate stage. In the third embodiment, an explanation will be given of a case where temperatures measured at a plurality of positions on the upper surface of the substrate stage are used to determine whether a substrate having a warp is placed at the right position and in the normal state on the substrate stage.

Figure 9:
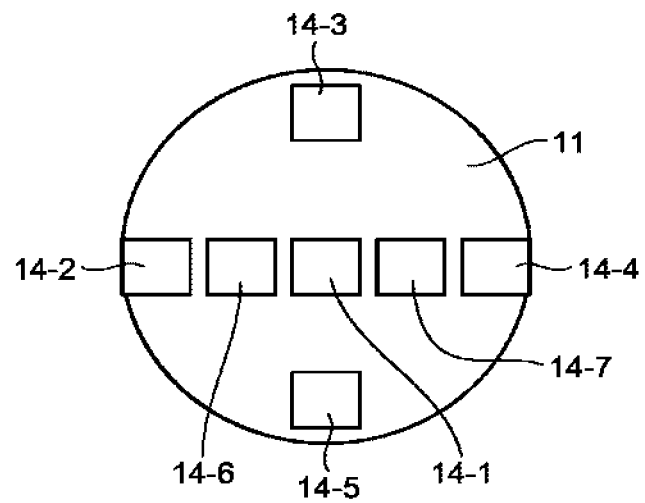
FIG. 9 is a diagram illustrating an example of the arrangement positions of temperature sensors in a heating processing apparatus according to a third embodiment.

A heating processing apparatus 10 according to the third embodiment has a configuration substantially the same as that illustrated in FIG. 1 according to the first embodiment. However, this apparatus 10 is different from that of the first embodiment in the arrangement position of the temperature sensor 14. FIG. 9 is a diagram illustrating an example of the arrangement positions of temperature sensors in the heating processing apparatus according to the third embodiment. As illustrated in FIG. 9, temperature sensors 14-1 to 14-7 are provided at a plurality of positions on the substrate stage 11. For example, in this configuration, the temperature sensor 14-1 is arranged at about the center of the substrate stage 11, the four temperature sensors 14-2 to 14-5 are arranged at peripheral portion of the substrate stage 11, and the temperature sensors 14-6 and 14-7 are respectively arranged between the temperature sensors 14-1 and 14-2 and between the temperature sensors 14-1 and 14-4.

In the third embodiment, the warp amount information includes warp amounts at positions of the substrate 100 which correspond to at least the positions on the substrate stage 11 where the temperature sensors 14 are arranged.

The estimation temperature profile calculation unit 16 creates an estimation temperature profile, on the basis of the maximum warp amount in the warp amount information, and calculates an estimation integral value of temperature change. Then, the estimation temperature profile calculation unit 16 outputs the estimation integral value thus calculated to the placement state detection unit 17.

With respect to each of the positions of the temperature sensors 14, the placement state detection unit 17 creates an actual measurement temperature profile, and calculates an actual measurement integral value of temperature change. Further, with respect to each of the positions of the temperature sensors 14, the placement state detection unit 17 determines whether the difference between the estimation integral value obtained from the estimation temperature profile calculation unit 16 and the actual measurement integral value is equal to or larger than a determination threshold.

For example, as illustrated in FIG. 4A, where a substrate 100 is warped with its peripheral portion present upward (the substrate 100 has a shape protruding downward), the central portion of the substrate 100 has a smaller warp amount, and the peripheral portion of the substrate 100 has a larger warp amount. Accordingly, the temperature change with the heating processing time on the upper surface of the substrate stage 11 is estimated to be larger at each of the temperature sensors 14-1, 14-6, and 14-7 arranged at about the central portion of the substrate stage 11, and its estimation integral value becomes a value substantially the same as that in a case of heating a substrate 100 having no warp. On the other hand, the temperature change with the heating processing time on the upper surface of the substrate stage 11 is estimated to be smaller at each of the temperature sensors 14-2 to 14-5 arranged at the peripheral portion of the substrate stage 11, and its estimation integral value becomes smaller than that in a case of heating a substrate 100 having no warp.

On the other hand, as illustrated in FIG. 4B, where a substrate 100 is warped with its central portion present upward (the substrate 100 has a shape protruding upward), the central portion of the substrate 100 has a larger warp amount, and the peripheral portion of the substrate 100 has a smaller warp amount. Accordingly, the temperature change with the heating processing time on the upper surface of the substrate stage 11 is estimated to be larger at each of the temperature sensors 14-2 to 14-5 arranged at the peripheral portion of the substrate stage 11, and its estimation integral value becomes a value substantially the same as that in a case of heating a substrate 100 having no warp. On the other hand, the temperature change with the heating processing time on the upper surface of the substrate stage 11 is estimated to be smaller at each of the temperature sensors 14-1, 14-6, and 14-7 arranged at about the central portion of the substrate stage 11, and its estimation integral value becomes smaller than that in a case of heating a substrate 100 having no warp.

As described above, the estimation integral value has different degrees at a position where the warp amount of the substrate 100 is larger and at a position where the warp amount is smaller. Accordingly, the placement state detection unit 17 performs the determination while varying the determination threshold depending on the warp amount. Specifically, at a position where the warp amount is larger, the determination threshold is set lower. For example, the warp amount and the determination threshold are correlated with each other in advance, and a determination threshold is obtained in accordance with a warp amount at each of the arrangement positions of the temperature sensors 14, so that the determination threshold can be varied.

Consequently, even where substrates 100 mutually have the same maximum warp amount and different shapes, it is possible to determine the placement state of each substrate 100 with high accuracy. Further, on the basis of determination results at all the positions of the temperature sensors 14-1 to 14-7 arranged on the substrate stage 11, it is possible to roughly specify a position not placed at the right position or a position not placed in the normal state, about the placement state of a substrate 100 on the substrate stage 11.

Here, the other constituent elements are substantially the same as those described in the first embodiment, and thus their description will be omitted. Further, a heating processing method serving as a semiconductor manufacturing method is substantially the same as that described in the first embodiment, and thus its description will be also omitted.

It should be noted that, although the above explanation has been given of a case where one estimation temperature profile is used for one substrate 100, the embodiment is not limited to this case. For example, it may be adopted, with respect to each of the arrangement positions of the temperature sensors 14 on the substrate stage 11, to create an estimation profile in accordance with a warp amount and to calculate an estimation integral value of temperature change from the estimation profile. In this case, the determination threshold may not be changed depending on each of the positions of the temperature sensors 14. Further, the contents of the third embodiment may be applied to the second embodiment. Further, the arrangement positions of the temperature sensors 14-1 to 14-7 and the number of sensors illustrated in FIG. 9 are mere examples. An arbitrary number of temperature sensors 14 may be arranged at arbitrary positions on the substrate stage 11.

In the third embodiment, the temperature sensors 14 are arranged at a plurality of positions on the substrate stage 11. With respect to each of the positions of the temperature sensors 14, it is determined whether the difference between an estimation integral value of temperature change and an actual measurement integral value of temperature change obtained from an actual measurement temperature profile is equal to or larger than a determination threshold. Consequently, even where substrates 100 mutually have the same maximum warp amount and different shapes, it is possible to determine the placement state of each substrate 100 with high accuracy. Further, on the basis of determination results at all the positions of the temperature sensors 14 arranged on the substrate stage 11, it is possible to roughly specify a position not placed at the right position or a position not placed in the normal state, about the placement state of a substrate 100 on the substrate stage 11.

Further, for example, even when a foreign substance is present on the substrate stage 11 at a position where the temperature change is small because a substrate 100 has a large warp amount, it is possible to determine the presence of the foreign substance with high accuracy.

The above explanation has been given of a case where an actual measurement integral value obtained from an actual measurement temperature profile and an estimation integral value obtained from an estimation temperature profile are used to perform the determination. However, the maximum value of temperature change in a temperature profile may be used as a change amount concerning temperature change obtained from the temperature profile.

Further, where the temperature profile is different depending on the warped shape of a substrate, a reference temperature profile may be prepared for every warped shape.

Figure 10:
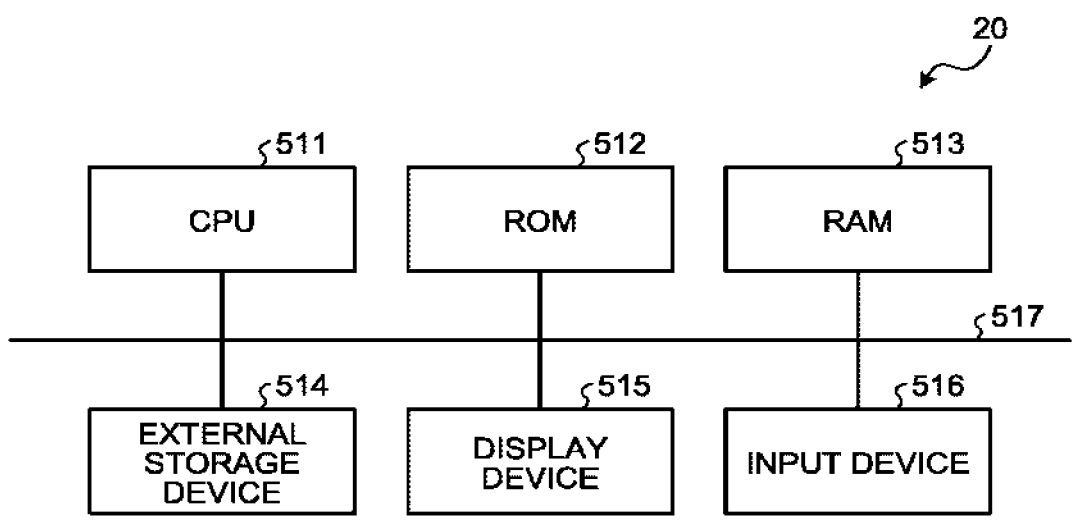
FIG. 10 is a diagram illustrating a hardware configuration example of a controller.

FIG. 10 is a diagram illustrating a hardware configuration example of the controller. The controller 20 has a hardware configuration utilizing an ordinary computer, in which a Central Processing Unit (CPU) 511, a Read Only Memory (ROM) 512, a Random Access Memory (RAM) 513 serving as the main storage device, an external storage device 514, such as a Hard Disk Drive (HDD), Solid State Drive (SSD), or Compact Disc (CD) drive device, a display device 515, such as a display, and an input device 516, such as a keyboard and/or a mouse, are included, and are connected to each other via a bus line 517.

A program to be executed by the controller 20 according to the embodiment has been prepared to perform the heating processing method illustrated in FIG. 7. This program is provided in a state recorded in a computer-readable recording medium, such as a CD-ROM, flexible disk (FD), CD-R, or Digital Versatile Disk (DVD), by a file in an installable format or executable format.

Alternatively, a program to be executed by the controller 20 according to the embodiment may be provided such that the program is stored in a computer connected to a network, such as the internet, and is downloaded via the network. Further, a program to be executed by the controller 20 according to the embodiment may be provided such that the program is provided or distributed via a network, such as the internet.

Alternatively, a program according to the embodiment may be provided in a state incorporated in a ROM or the like in advance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A heating processing apparatus comprising:
a substrate stage including a heater built therein;
a temperature sensor configured to measure temperature of a substrate mounting surface of the substrate stage; and
a controller configured to control heating to a substrate on the substrate stage, and to detect abnormality of a placement state of the substrate on the substrate stage, wherein
the controller is configured
to calculate an estimation temperature profile, which represents a change with time in temperature of the substrate mounting surface in a state where the substrate is placed on the substrate stage, from warp amount information indicating a warp of the substrate, and
to detect abnormality of a placement state of the substrate, on a basis of a difference between an actual measurement temperature profile, which represents a change with time in actual temperature measured by the temperature sensor in a state where the substrate is placed on the substrate stage, and the estimation temperature profile.

2. The heating processing apparatus according to claim 1, wherein the controller is configured
to calculate a first change amount concerning temperature change in the estimation temperature profile,
to calculate a second change amount concerning temperature change in the actual measurement temperature profile, and
to detect abnormality of a placement state of the substrate by using a difference between the first change amount and the second change amount.

3. The heating processing apparatus according to claim 2, wherein
the first change amount is an integral value of temperature change in the estimation temperature profile, and
the second change amount is an integral value of temperature change in the actual measurement temperature profile.

4. The heating processing apparatus according to claim 2, wherein
the first change amount is a maximum value of temperature change in the estimation temperature profile, and
the second change amount is a maximum value of temperature change in the actual measurement temperature profile.

5. The heating processing apparatus according to claim 1, wherein the temperature sensor is arranged at a center of the substrate stage.

6. The heating processing apparatus according to claim 1, wherein
the temperature sensor includes a plurality of temperature sensors arranged on the substrate stage, and the controller is configured to detect abnormality of a placement state of the substrate, at each position provided with one of the temperature sensors on the substrate stage.

7. The heating processing apparatus according to claim 6, wherein
the controller is configured to detect abnormality of the placement state of the substrate by comparing a difference between the actual measurement temperature profile and the estimation temperature profile with a determination threshold detecting abnormality of a placement state of the substrate, and
the determination threshold is set different depending on a warp amount of the substrate at each position provided with one of the temperature sensors.

8. The heating processing apparatus according to claim 6, wherein
the warp amount information includes a warp amount at each position provided with one of the temperature sensors on the substrate stage, and
the controller is configured
to calculate the estimation temperature profile by calculating the estimation temperature profile in accordance with the warp amount at each position provided with one of the temperature sensors, and
to detect abnormality of the placement state of the substrate, by comparing with each other the actual measurement temperature profile and the estimation temperature profile, at each position provided with one of the temperature sensors.

9. The heating processing apparatus according to claim 1, further comprising a warp amount information measuring sensor to measure warp amount information indicating a warp of the substrate.

10. The heating processing apparatus according to claim 1, wherein, the controller is configured to calculate the estimation temperature profile by
acquiring a third change amount correlated with a maximum warp amount in warp amount information about the substrate, from integral value calculation information that correlates a maximum warp amount of a substrate with a change amount concerning temperature change in a temperature profile,
calculating a coefficient value, which is a ratio of the third change amount relative to a fourth change amount concerning temperature change in a reference temperature profile in a case where the substrate has no warp, and
calculating the estimation temperature profile from the reference temperature profile in accordance with a predetermined algorithm using the coefficient value.

11. A heating processing method comprising:
calculating an estimation temperature profile, which represents a change with time in temperature of a substrate mounting surface of a substrate stage including a heater built therein in a state where a substrate is placed on the substrate stage, from warp amount information indicating a warp of the substrate;
creating an actual measurement temperature profile, which represents a change with time in actual temperature of the substrate mounting surface measured by a temperature sensor in a state where the substrate is placed on the substrate stage; and
detecting abnormality of a placement state of the substrate, on a basis of a difference between the actual measurement temperature profile and the estimation temperature profile.

12. The heating processing method according to claim 11, wherein,
in the calculating the estimation temperature profile, a first change amount concerning temperature change in the estimation temperature profile is calculated,
in the creating the actual measurement temperature profile, a second change amount concerning temperature change in the actual measurement temperature profile is calculated, and
in the detecting abnormality of the placement state, abnormality of the placement state of the substrate is detected by using a difference between the first change amount and the second change amount.

13. The heating processing method according to claim 12, wherein
the first change amount is an integral value of temperature change in the estimation temperature profile, and
the second change amount s an integral value of temperature change in the actual measurement temperature profile.

14. The heating processing method according to claim 12, wherein
the first change amount is a maximum value of temperature change in the estimation temperature profile, and
the second change amount s a maximum value of temperature change in the actual measurement temperature profile.

15. The heating processing method according to claim 11, wherein the temperature sensor is arranged at a center of the substrate stage.

16. The heating processing method according to claim 11, wherein
the temperature sensor includes a plurality of temperature sensors arranged on the substrate stage, and
in the detecting abnormality of the placement state, abnormality of the placement state of the substrate is detected, at each position provided with one of the temperature sensors on the substrate stage.

17. The heating processing method according to claim 16, wherein,
in the detecting abnormality of the placement state, a difference between the actual measurement temperature profile and the estimation temperature profile is compared with a determination threshold detecting abnormality of the placement state of the substrate, and
the determination threshold is set different depending on a warp amount of the substrate at each position provided with one of the temperature sensors.

18. The heating processing method according to claim 16, wherein
the warp amount information includes a warp amount at each position provided with one of the temperature sensors on the substrate stage, and
in the calculating the estimation temperature profile, an estimation temperature profile is calculated in accordance with the warp amount at each position provided with one of the temperature sensors, and
in the detecting abnormality of the placement state, the actual measurement temperature profile is compared with the estimation temperature profile, at each position provided with one of the temperature sensors.

19. The heating processing method according to claim 11, further comprising measuring warp amount information about the substrate before the calculating the estimation temperature profile.

20. The heating processing method according to claim 11, wherein the calculating the estimation temperature profile includes
acquiring a third change amount correlated with a maximum warp amount in warp amount information about the substrate, from integral value calculation information that correlates a maximum warp amount of a substrate with a change amount concerning temperature change in a temperature profile,
calculating a coefficient value, which is a ratio of the third change amount relative to a fourth change amount concerning temperature change in a reference temperature profile in a case where the substrate has no warp, and
calculating the estimation temperature profile from the reference temperature profile in accordance with a predetermined algorithm using the coefficient value.

* * * * *